United States Patent
Yu et al.

(10) Patent No.: US 8,179,726 B2
(45) Date of Patent: *May 15, 2012

(54) METHOD AND APPARATUS FOR PROGRAMMING FLASH MEMORY

(75) Inventors: Erwin E. Yu, San Jose, CA (US); Ebrahim Abedifard, Sunnyvale, CA (US); Frederick T. Jaffin, Gilroy, CA (US); Uday Chandrasekhar, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/154,470

(22) Filed: Jun. 7, 2011

(65) Prior Publication Data

US 2011/0235429 A1    Sep. 29, 2011

Related U.S. Application Data

(63) Continuation of application No. 12/685,722, filed on Jan. 12, 2010, now Pat. No. 7,974,129, which is a continuation of application No. 11/433,562, filed on May 15, 2006, now Pat. No. 7,663,925.

(51) Int. Cl.
*G11C 16/04* (2006.01)

(52) U.S. Cl. .......... 365/185.19; 365/185.18; 365/185.22

(58) Field of Classification Search ............. 365/185.19, 365/185.18, 185.22
See application file for complete search history.

(56) References Cited

U.S. PATENT DOCUMENTS

| | | | |
|---|---|---|---|
| 5,440,505 A | 8/1995 | Fazio et al. | 365/45 |
| 5,677,873 A | 10/1997 | Choi et al. | |
| 5,715,194 A | 2/1998 | Hu | |
| 5,751,637 A | 5/1998 | Chen et al. | 365/185.33 |
| 5,812,457 A | 9/1998 | Arase | |
| 5,943,260 A | 8/1999 | Hirakawa | 365/185.03 |
| 5,991,201 A | 11/1999 | Kuo et al. | 365/185.19 |
| 6,272,586 B1 | 8/2001 | Roohparvar et al. | 711/103 |
| 6,343,033 B1 | 1/2002 | Parker | |
| 6,366,496 B1 | 4/2002 | Torelli et al. | 365/185.19 |
| 6,920,066 B2 | 7/2005 | Pascucci et al. | 365/185.03 |
| 7,139,192 B1 | 11/2006 | Wong | 365/185.03 |
| 7,230,852 B2 * | 6/2007 | Mitani et al. | 365/185.18 |
| 7,480,187 B2 | 1/2009 | Hwang | 365/185.33 |
| 7,663,925 B2 | 2/2010 | Yu et al. | 365/185.19 |
| 7,974,129 B2 * | 7/2011 | Yu et al. | 365/185.19 |
| 2002/0191444 A1 | 12/2002 | Gregori et al. | 365/185.19 |
| 2003/0067809 A1 | 4/2003 | Wooldridge | |
| 2005/0083735 A1 | 4/2005 | Chen et al. | |
| 2005/0254306 A1 | 11/2005 | Wang | 365/185.22 |
| 2005/0259468 A1 | 11/2005 | Violette | |

* cited by examiner

*Primary Examiner* — Huan Hoang
(74) *Attorney, Agent, or Firm* — Dickstein Shapiro LLP

(57) ABSTRACT

A method and apparatus that provides the ability to control programming pulses having different widths and/or voltages in a flash memory device. The widths and/or voltage levels of programming pulses are set to achieve programming of all memory cells of an array using a minimum number of programming pulses.

20 Claims, 5 Drawing Sheets

METHOD AND APPARATUS FOR PROGRAMMING FLASH MEMORY

CROSS REFERENCE TO RELATED APPLICATIONS

This application is a continuation of U.S. patent application Ser. No. 12/685,722, filed Jan. 12, 2010, now U.S. Pat. No. 7,974,129, which is a continuation of U.S. patent application Ser. No. 11/433,562, filed May 15, 2006, now U.S. Pat. No. 7,663,925, both of which are incorporated by reference in their entirety.

FIELD OF THE INVENTION

The present invention relates to a method and apparatus for programming memory and, more particularly, to a method and apparatus for programming a flash memory device.

BACKGROUND OF THE INVENTION

A nonvolatile memory is a type of memory that retains stored data when power is removed. There are various types of nonvolatile memories including e.g., read only memories (ROMs), erasable programmable read only memories (EPROMs), and electrically erasable programmable read only memories (EEPROMs). One type of EEPROM device is a flash EEPROM device (also referred to as "flash memory").

Each nonvolatile memory device has its own unique characteristics. For example, the memory cells of an EPROM device are erased using an ultraviolet light, while the memory cells of an EEPROM device are erased using an electrical signal. In a conventional flash memory device blocks of memory cells are simultaneously erased (what has been described in the art as a "flash-erasure"). The memory cells in a ROM device, on the other hand, cannot be erased at all. EPROMs, and EEPROMs, including flash memory, are commonly used in computer systems that require reprogrammable nonvolatile memory.

Two common types of flash memory architectures are the "NAND" and "NOR" architectures, so called for the resemblance which the basic memory cell configuration of each architecture has to a basic NAND or NOR gate circuit, respectively. In the NOR architecture, the floating gate memory cells of the memory array are arranged in a matrix. The gates of each floating gate memory cell of the array matrix are connected by rows to word lines and their drains are connected to bit lines. The source of each floating gate memory cell is typically connected to a common source line. The NOR architecture floating gate memory array is accessed by a row decoder activating a row of floating gate memory cells by selecting the word line connected to their gates. The data values of memory cells in a selected row are placed on the bit lines based on the application of a current from the connected source line to the connected bit lines.

A NAND array architecture also arranges its array of floating gate memory cells in a matrix such that the gates of each floating gate memory cell are connected by rows to word lines. However, each memory cell is not directly connected to a source line and a bit line. Instead, the memory cells of the array are arranged together in strings, typically of 8, 16, 32, or more, where the memory cells in the string are connected together in series, source to drain, between a common source line and a bit line. The NAND architecture floating gate memory array is then accessed by a row decoder activating a row of floating gate memory cells by selecting the word line connected to their gates. In addition, the word lines connected to the gates of the unselected memory cells of each string are also driven. However, the unselected memory cells of each string are typically driven by a higher gate voltage so as to operate them as pass transistors, allowing them to pass current in a manner that is unrestricted by their stored data values. Current then flows from the bitline to the source line through the channel of each memory cell of the connected string, restricted only by the memory cells of each string that are selected to be read. Thereby, the current encoded stored data values of the row of selected memory cells are placed on the bit lines.

Generally, in a flash memory device, a charged floating gate represents one logic state, e.g., a logic "0", while a non-charged floating gate represents the opposite logic state e.g., a logic "1". A memory cell of a flash array is programmed by placing the floating gate into one of these charged states. Charges may be injected or written onto the floating gate by any number of methods, including e.g., avalanche injection, channel injection, Fowler-Nordheim tunneling, and channel hot electron (CHE) injection. The floating gate may be discharged or erased by any number of methods including e.g., Fowler-Nordheim tunneling.

During a typical erase operation using Fowler-Nordheim tunneling, charges stored on the floating gate are driven out of the floating gate, through the tunnel oxide, and into the source region. This tunneling of electrons may be achieved by applying a relatively low positive voltage (e.g., approximately 5 volts) to the source region and a relatively large negative voltage (e.g., −8 to −12 volts) to the control gate. The substrate is usually grounded and the drain region is usually left floating. These voltages create an electric field between the floating gate and the source region, which induces the electrons previously stored on the floating gate to tunnel through the tunnel oxide to the source region.

Programming of a flash device is typically achieved by biasing with a series of pulses the drain region to a first voltage, relative to the source region, and biasing the control gate to a second positive voltage which is greater than the first voltage. In the absence of any stored charge on the floating gate, this biasing causes the formation of an inversion-layer channel of electrons at the face of the substrate, between the source and drain regions. The drain-to-source voltage accelerates the electrons through the channel to the drain region where they acquire sufficiently large kinetic energy. The larger positive bias on the control gate also establishes an electrical field in a tunneling oxide layer which separates the floating gate from the channel region. This electric field attracts the electrons and accelerates them toward the floating, gate, which is between the control gate and the channel region, by a process known as tunneling. The floating gate then accumulates and traps the accumulated charge. The negative charge that accumulates on the floating gate reduces the strength of the electric field in the tunneling oxide layer to the point where it is no longer capable of accelerating the electrons from the drain side of the channel region.

The accumulation of a large quantity of trapped charge (electrons) on the floating gate will cause the effective threshold voltage of the field effect transistor comprising the source region, drain region, channel region and control gate to increase. If this increase is sufficiently large, the field effect transistor will remain in a nonconductive off state when a predetermined "read" voltage is applied to the control gate during a read operation. In the programmed state, the flash device may be said to be storing a logic 0. Once programmed, the flash device retains its higher threshold voltage even when its power supply is interrupted or turned off for long periods of time. However, over programming of a flash memory cell can occur when the voltage of the memory cell is driven above the optimal threshold voltage. Over programming can lead to the inaccurate or even inability to read a memory cell during a read cycle.

Reading the flash device is achieved by applying a predetermined read voltage to the control gate, typically via a word line connecting a row of identical flash devices or cells, and applying a positive bias to the drain region, typically via a bit line connecting a column of identical flash cells. If the flash device is programmed, it will not conduct drain current. However, if the flash device has not been programmed (or has been erased), it is conductive. In this conductive state, the flash device may be said to be storing a logic 1. Thus, by monitoring the bit line current, the programmed state (i.e., 1 or 0) of the cells of the flash device can be determined.

As previously noted, pulses are applied to the lines of a memory array during programming. In order to program an individual memory cell, the voltage of the memory cell is raised (i.e., shifted), by the applied bias and bias pulses, to a programming threshold voltage $V_{TH}$. Memory cells of an array vary in the speed in which they are programmed. Accordingly, the threshold voltage shift of memory cells occurs at varying speeds even though a pulse of the same voltage and width is applied to all of the memory cells of the array. The distribution of the speeds at which the memory cells are programmed follows a typical bell curve. Accordingly, there are memory cells that are slow to program and fast program, as well as those that are neither fast nor slow (i.e., program at an average speed). The wide distribution of programming times may lead to over programming of some of the memory cells. Accordingly, there is a need and desire for a method which provides a tighter programming distribution by allowing more programming control options for a flash memory device.

BRIEF DESCRIPTION OF THE DRAWINGS

The foregoing and other advantages and features of the invention will be more readily understood from the following detailed description of the invention provided below with reference to the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention.

The invention, in various exemplary embodiments, relates to a method and apparatus for controlling the electrical characteristics of the programming pulses used to program a flash memory device.

In one embodiment of the invention, the widths and voltage levels of programming pulses are controllably set to achieve memory cell programming using a required number of pulses. Pulse widths are controlled independently of each other and are controllably set to best suit a particular flash memory device. Furthermore, controlling the width and voltage of the programming pulses can lead to a reduction of program cycle time and threshold distribution while the likelihood that a memory cell becomes over programmed decreases.

Figure 1:
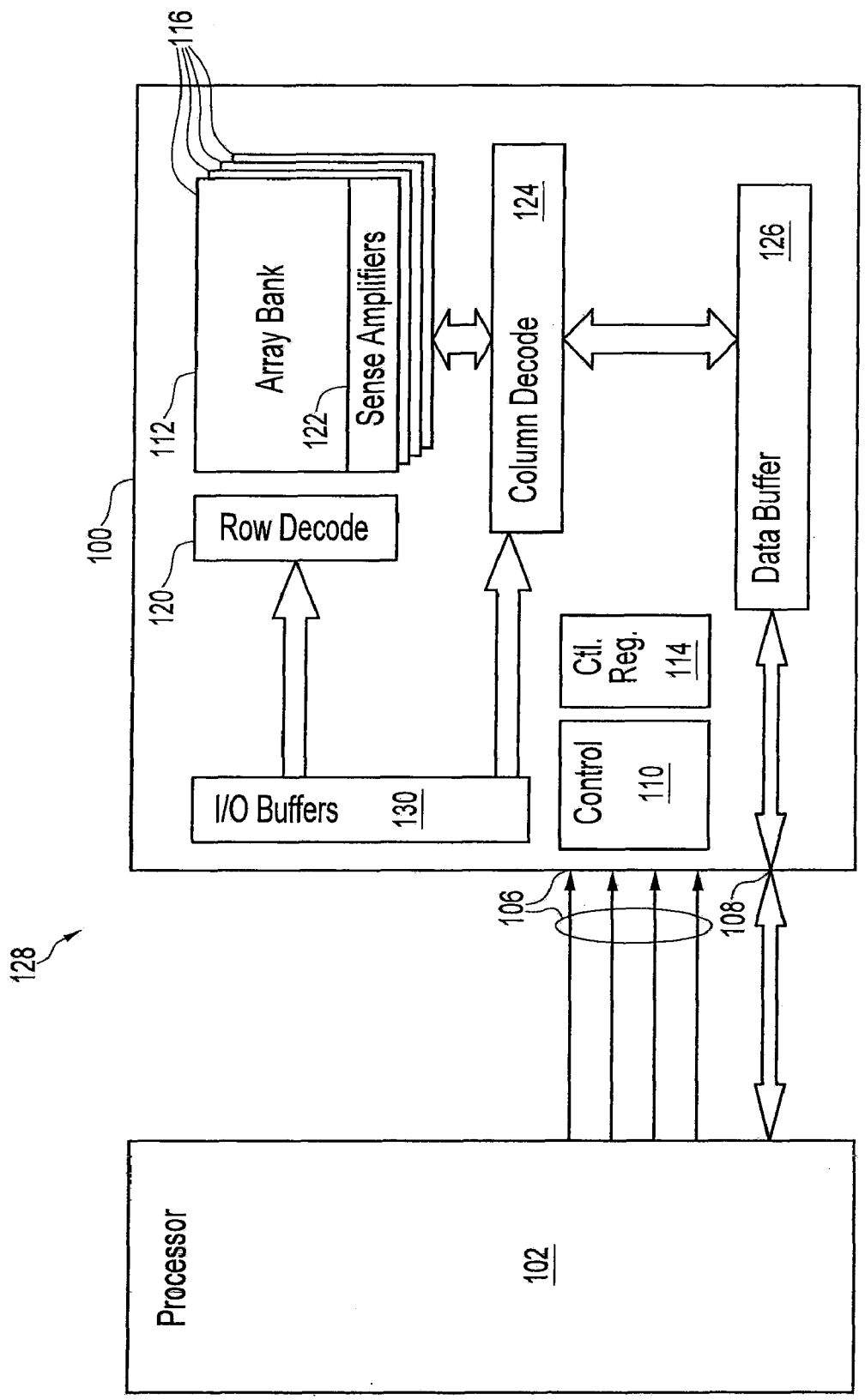
FIG. 1 illustrates an exemplary simplified block diagram of system containing a flash memory device.

FIG. 1 illustrates an exemplary system 128 incorporating a flash memory device 100 according to an embodiment of the present invention. The flash memory device 100 is connected to a host 102, which is typically a processor, other processing device or memory controller. The flash memory device 100 is connected to a control bus 106 and an address/data bus 108 that are each connected to the processing device 102 to allow memory read and write accesses. It is noted that in alternative embodiments, the address/data bus 108 can be divided into separate buses. Internal to the flash memory device 100, a control state machine 110 directs internal operations; manages the flash memory array 112 and updates RAM control registers and non-volatile erase block management registers 114. The registers 114 (which may include tables) are utilized by the control state machine 110 during operation of the flash memory 100.

The flash memory array 112 contains a sequence of memory banks 116 or segments, each bank 116 being organized logically into a series of erase blocks. Memory access addresses are received on the address/data bus 108 and are divided into row and column address portions. On a read access the row address is latched and decoded by row decode circuit 120, which selects and activates a row page of memory cells and the other memory cells in their associated strings across a selected memory bank and communicates with I/O buffers 130. The bit values encoded in the output of the selected row of memory cells are connected to a global bit line and detected by sense amplifiers 122 associated with the memory bank. The column address for the access is latched and decoded by the column decode circuit 124 which communicates with I/O buffers 130. The output of the column decode circuit 124 selects the desired column data from the sense amplifier outputs 122 and is connected to the data buffer 126 for transfer from the memory device 100 through the address/data bus 108. On a write access, the row decode circuit 120 selects the row page and the column decode circuit 124 selects the write sense amplifiers 122. Data values to be written are connected from the data buffer 126 to the write sense amplifiers 122 selected by the column decode circuit 124 and are then written to the selected floating gate memory cells of the memory array 112. The written memory cells are then reselected by the row and column decode circuits 120, 124 and sense amplifiers 122 so that they can be read to verify that the correct values have been programmed into the selected memory cells.

Figure 2:
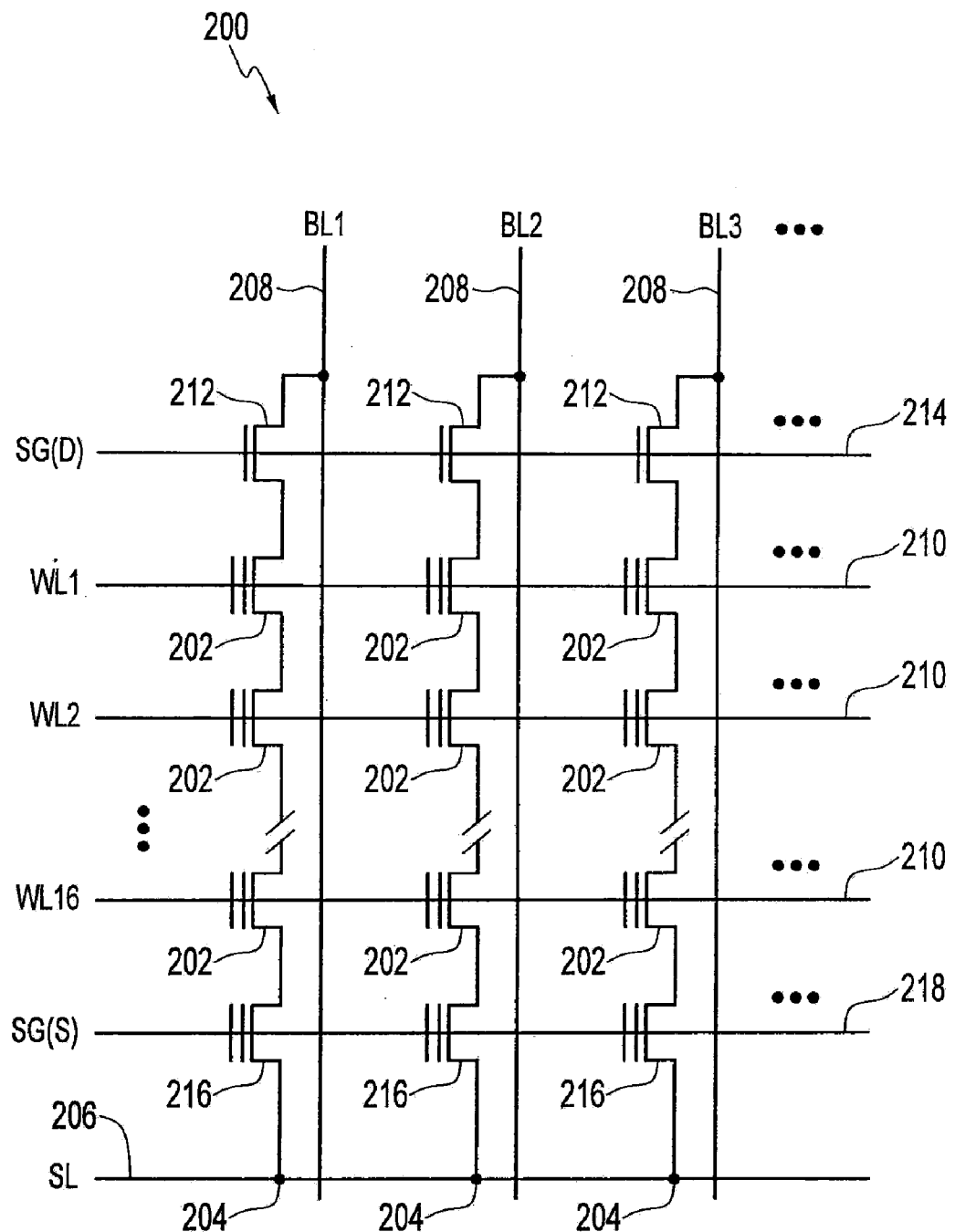
FIG. 2 illustrates an exemplary view of a memory array structure in a NAND type flash memory device.

FIG. 2 shows an exemplary diagram of a NAND flash memory array 200. The invention may be implemented on a NAND flash memory array 200, among others, but the description of the invention in connection with NAND flash memory should not be considered limiting. For example, the embodiments described herein may similarly be implemented in a NOR or other type of flash memory device.

The NAND flash memory array 200 comprises a sequence of floating gate memory cell strings 204. Each floating gate memory cell string 204 contains 16 NMOS floating gate memory cells 202 that are connected drain to source in a series chain. Word lines (WL1-WL16) 210 that span across multiple strings 204 are connected to the control gates of every floating gate memory cell 202 to control their operation. In operation, a particular word line 210 selects the individual floating gate memory cell 202 in the string 204 to be written to or read from, while the other word lines operate the remaining floating gate memory cells 202 in the string 204 in the pass through mode. Each string 204 of floating gate memory cells 202 are connected to a source line (SL) 206 by a source select gate 216 and to a respective bit line (BL1-BLN) 208 by a drain select gate 212. The source select gates 216 are controlled by a source select gate control line (SG(S)) 218 connected to their control gates. The drain select gates 212 are controlled by a drain select gate control line (SG(D)) 214.

The present invention provides the ability to vary the width of the first and subsequent pulses applied to the word lines WL 210, as well as the ability to vary the voltage level of each program pulse for particular memory specifications. Some of the characteristics of the programming pulses of each die are set by product engineers, for example, during sorting and/or testing of the die to meet the required programming specifications. The dies are programmed with pulse voltage and width values in accordance on the die's programming speed.

As programming pulses are applied to the control gate of a memory cell 202, the threshold voltage of the memory cell 202 rises from an initial voltage $V_1$ towards the program threshold voltage $V_{TH}$ (i.e., the threshold voltage of the memory cell shifts with the application of each programming pulse). Once the program threshold voltage $V_{TH}$ is reached, the memory cell 202 is programmed.

Figure 3:
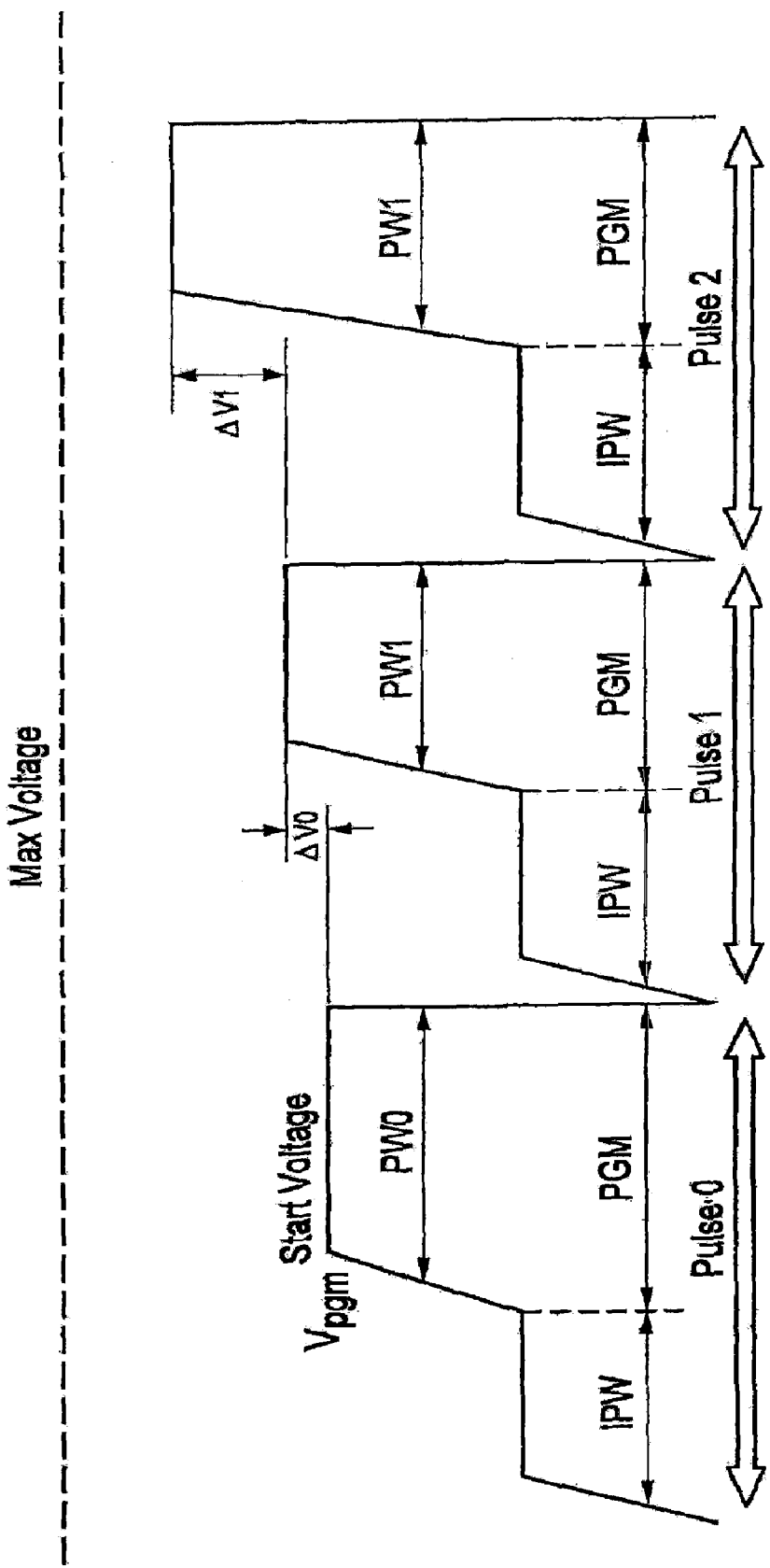
FIG. 3 illustrates exemplary pulses applied to a word line during programming of a flash memory cell according to an embodiment of the invention.

FIG. 3 illustrates exemplary pulses applied to the word lines WL 210, for example, of a memory array 200 during memory cell 202 programming. The word lines WL 210 are coupled to the control gates of the memory cell transistors in respective rows of the array. The pulses are applied to a specific word line WL 210 which is decoded from a supplied address. Each pulse applied to the word lines 210 for programming is composed of an inhibit pulse IPW and a program pulse PGM. The width and height of each inhibit pulse IPW is the same for each pulse (i.e., PULSE 0, PULSE 1, PULSE 2) applied. According to an exemplary embodiment of the invention, the width PW0 of the program pulse PGM of the first pulse PULSE 0, that is applied to a word line WL 210 is wider than the width PW1 of the succeeding program pulses PGM. The width PW0 of the first programming pulse of PULSE 0 is set based on the implementation of the memory array 200 (e.g., the characteristics of the programming pulses of each die are set by product engineers during sorting and/or testing of the die to meet the required programming specifications). The width PW0 is selected based on the implementation to provide a voltage shift of the memory cell 202 during the application of the first pulse PULSE 0 which is sufficient to reduce the threshold voltage shift required by the succeeding pulses. In the illustrated embodiment, the width PW0 of the first pulse PULSE 0 is larger than the width PW1 of the subsequent pulses. The exact pulse widths PW0, PW1 are selected based on the program timing specifications of the memory. The advantages of using an independently varied width for the programming pulse of the first pulse PULSE 0, is that it provides the flexibility to apply the most efficient program pulse width for the first pulse PULSE 0 and the shortest possible widths for the subsequent program pulses.

As previously noted, some memory cells 202 are very fast to program and require the application of only one programming pulse to reach the programming threshold voltage $V_{TH}$, whereas the memory cells 202 that are slow to program require the application of multiple pulses in order to reach the program threshold voltage $V_{TH}$. Accordingly, the voltage level of the first programming pulse PULSE 0 is controllably set such that the threshold voltage shift of the fast to program memory cells 202 will decrease once a saturation point (e.g., acceptable program threshold voltage $V_{TH}$) is reached. The width of the first programming pulse PULSE 0 may also be controllably set to be wide enough to cause a tangible threshold voltage shift on the slower to program memory cells 202 while maintaining a short program cycle. After the first pulse PULSE 0 is applied to the memory cell 202, a verification of the threshold voltage is performed. The cells which are determined to be programmed during the verification will not receive subsequent programming pulses.

The voltage of the first programming PULSE 1 is controllably set such that the second pulse PULSE 1 has voltage higher than that of the first pulse PULSE 0 (e.g., the voltage $\Delta V_0$ increase may be approximately 250 mV). The fast and average to program memory cells 202 will program during the first and second pulse applications. During the application of these programming pulses, the threshold voltage of the slow to program memory cells 202 will continue to shift toward the programming threshold voltage $V_{TH}$. After the application of the first and second programming pulses PULSE 0, PULSE 1, the threshold voltage shift of the memory cells 202 should be approximately equal to the voltage increment of each subsequent programming pulse (e.g., $\Delta V_1$). The voltage increase between the second and third programming pulses PULSE 1, PULSE 2 can be as high as 1V, for example. The voltage of the third programming pulse PULSE 2 is varied such that slower to program cells are programmed quickly by increasing the voltage increment $\Delta V_1$ in order to accelerate the programming time. If the acceptable program threshold voltage level is, for example, between 1V-3V then the voltage level of the first and second programming pulses PULSE 0, PULSE 1 can be controllably set to program the fast and average cells to a program threshold voltage $V_{TH}$ of 1V and the third pulse voltage controllably set with $\Delta V_1 = 1V$ so that the slower to program memory cells 202 will be programmed to a programming threshold voltage $V_{TH}$ between 1V-2V. This leads to a tight programming distribution (i.e., faster programming time).

According to an exemplary embodiment of the invention, the voltage of the first pulse PULSE 0 is $V_{pgm}$. The voltage of the pulses PULSE 1, PULSE 2 subsequent to the first pulse PULSE 0 may be set based on the voltages of the programming pulses PGM. The voltage of the second pulse PULSE 1 is $\Delta V_0$ larger than $V_{pgm}$ of PULSE 0 and the voltage of the third pulse PULSE 2 is greater than the voltage of the second pulse PULSE 1 by $\Delta V_1$. Although three pulses are illustrated in FIG. 3, the invention is not limited to the use of three programming pulses.

Once the threshold voltage of a memory cell 202 reaches a certain threshold voltage level $V_x$, the threshold voltage of the memory cell 202 will shift with the application of a programming pulse by approximately the voltage level as the change in voltage of the programming pulse from the preceding program pulse (e.g., $\Delta V_0$, $\Delta V_1$). For example, if the voltage change $\Delta V_0$ of the second program pulse PGM is 250 mV, then with application of PULSE 1, the voltage level of the memory cell 202 will shift approximately 250 mV towards the threshold voltage $V_{TH}$. However, before the voltage level $V_x$ is reached, there is no direct correlation between the voltage shift of the memory cell 202 and the voltage of the programming pulse (i.e., programming of the memory cell does not follow a linear trend). The memory cells 202 which program at approximately an average speed or faster are more likely to reach this memory cell voltage level $V_x$ with the application of the initial programming voltage $V_{pgm}$ of the first pulse; however, the slower to program memory cells do not reach this voltage level $V_x$ with the application of the initial programming voltage $V_{pgm}$ (i.e., PULSE 0 illustrated in FIG. 3).

After each pulse PULSE 0, PULSE 1, PULSE 2 is applied to a selected word line WL 210 of the memory array 220, a read is initiated (i.e., a verify read) and the data read from the array is compared with the data programmed into the array. If there is a verify fail, one or more of the memory cells has not been programmed (i.e., $V_{TH}$ has not been reached) and subsequent pulses (e.g., PULSE 1, PULSE 2) are applied, usually having higher voltage levels, until the threshold voltage $V_{TH}$ is met or a predetermined maximum number of pulses is reached for all memory cells. As previously described, a count is maintained of the program pulses PGM applied to the memory cell and a predetermined number of pulses may be applied to the memory cell during programming to reach the threshold voltage $V_{TH}$. If the predetermined number of pulses is reached and the read verify does not verify that programming has occurred for the array, a programming failure occurs. The predetermined maximum number of pulses can be set individually for each memory device.

Figure 4:
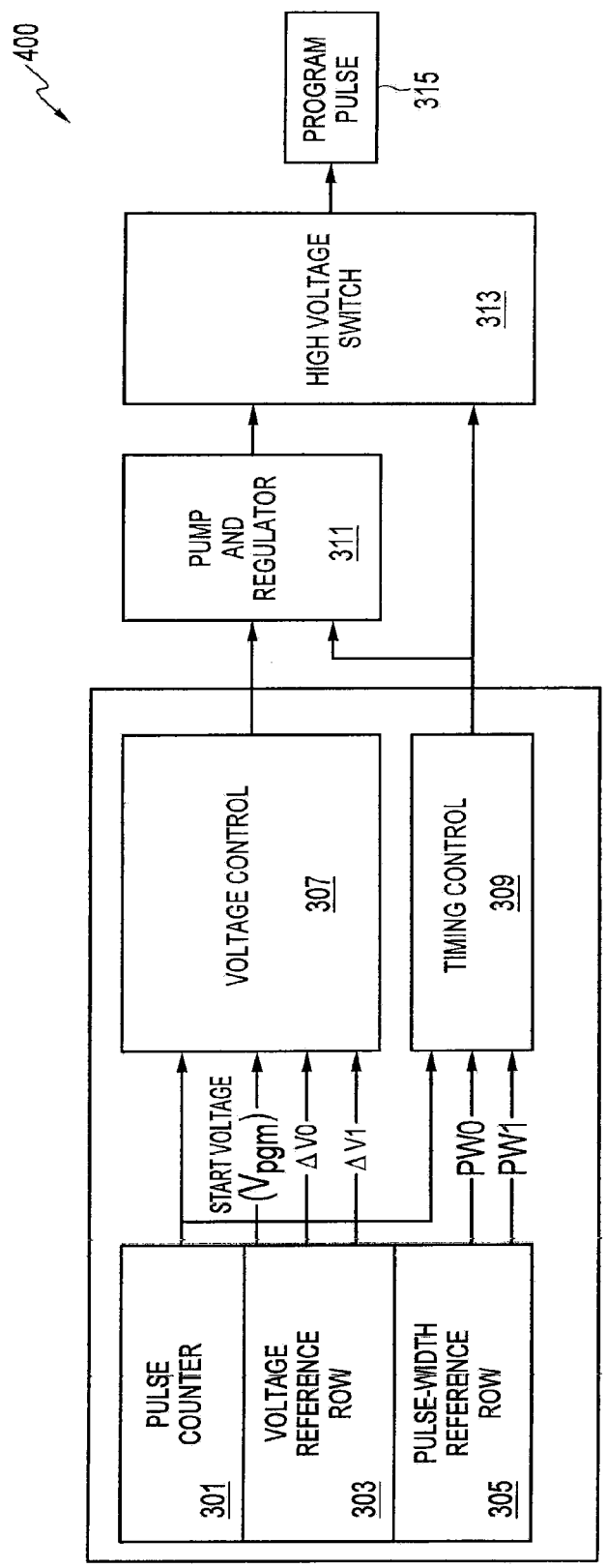
FIG. 4 illustrates a block diagram illustrating a voltage and timing control circuit according to an embodiment of the invention.

FIG. 4 illustrates an exemplary block diagram of a circuit 400, according to one embodiment of the invention, for controlling the pulse width PW0, PW1 and voltage variation $\Delta V_0$, $\Delta V_1$ used to implement variable programming of memory cells in a flash array according to an exemplary embodiment. The circuit 400 illustrated in FIG. 4 may be part of a programming control circuit or other type of control circuit that is either built in on the memory device or connected to the memory device. A pulse counter 301 keeps track of the number of programming of pulses applied to a memory cell. As previously noted, after each pulse is applied to the memory cell array, a read verify is initiated. If the pulse counter 301 has reached the predetermined maximum number of pulses, no additional pulses will be generated by the circuit 400 to program the memory cell. A voltage reference ROM 303 determines the voltage differentials $\Delta V_0$, $\Delta V_1$ that are used by the voltage control block 307 to control generation of the pulses PULSE 0, PULSE 1, PULSE 2 in accordance with an exemplary embodiment of the invention. The voltage differentials $\Delta V_0$, $\Delta V_1$, the initial programming voltage $V_{pgm}$, shown in FIG. 4 as the start voltage, and the number of pulses are used by the voltage control block 307 to generate control signals that determine the voltage levels of the program pulses. Based on the number of pulses, the initial programming voltage $V_{pgm}$, and the voltage differentials $\Delta V_0$, $\Delta V_1$, the voltage control block 307 regulates a pump and regulator 311 to set the appropriate pulse voltage levels.

A pulse-width reference ROM 305 provides the timing information (i.e., pulse widths PW0, PW1) for the programming pulses of pulses PULSE 0, PULSE 1, PULSE 2 illustrated in FIG. 3. Using the number of pulses and the pulse widths PW0, PW1, the timing control block 309 generates signals to control when the pump and regulator 311 is turned on and discharged. Timing control 309 also controls the activation of the high voltage switch 313 to pass the pulses (e.g., PULSE 0, PULSE 1, PULSE 2) and thus controls the width of the pulses. The voltage switch 313 outputs the program pulses 315 to be applied to the memory cells.

The independently set pulses help shift the memory cell's voltage to the threshold programming voltage level more quickly and using a minimum number of pulses. The flexibility provided by the ability to set the width and voltage parameters of the program pulses leads to the reduction of program cycle time and threshold distribution. Additionally, the independently set pulse width and voltages decrease the likelihood that any memory cell becomes over programmed.

Figure 5:
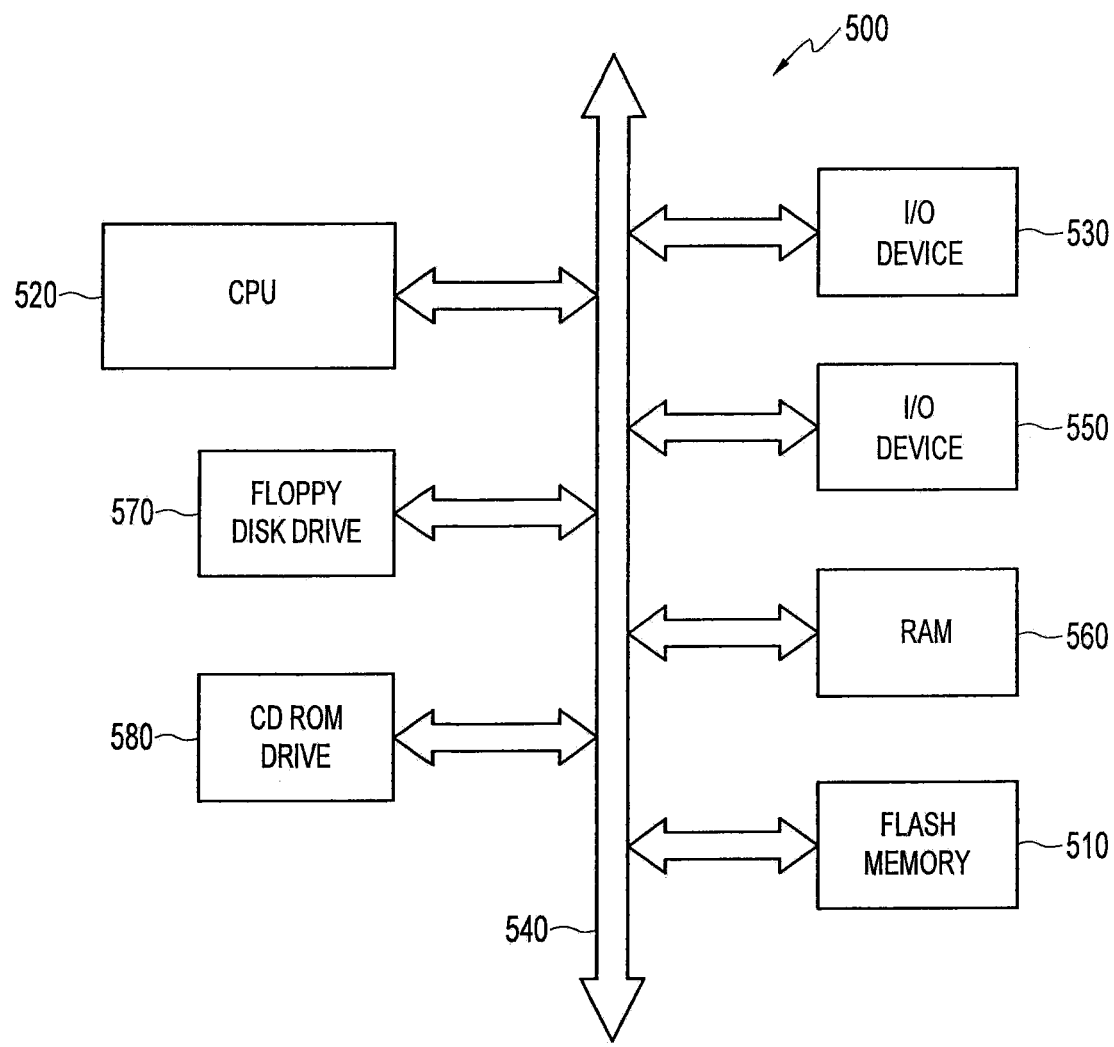
FIG. 5 illustrates a processor system incorporating a flash memory device constructed in accordance with an embodiment of the invention.

FIG. 5 is a block diagram of a processor system 500 utilizing a memory device, e.g., a flash memory device 510, constructed in accordance with the present invention. That is, the memory device 510 is programmed by individually tailored programming pulses in accordance with the embodiments of the invention. The processor system 500 may be a computer system, a process control system or any other system employing a processor and associated memory. The system 500 includes a central processing unit (CPU) 520, e.g., a microprocessor, that communicates with the flash memory 510 and an I/O device 530 over a bus 540. It must be noted that the bus 540 may be a series of buses and bridges commonly used in a processor system, but for convenience purposes only, the bus 540 has been illustrated as a single bus. A second I/O device 550 is illustrated, but is not necessary to practice the invention. The processor system 500 also includes random access memory (RAM) device 560 and may include a read-only memory (ROM) device (not shown), and peripheral devices such as a floppy disk drive 570 and a compact disk (CD) ROM drive 580 that also communicate with the CPU 520 over the bus 540 as is well known in the art.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, the feature of increasing voltage increments of the programming pulses described herein maybe disabled for a particular implementation or the pulse characteristics, including pulse width, may be the same for the second and further subsequent programming pulses. Any modification of the present invention that comes within the spirit and scope of the following claims should be considered part of the present invention.

What is claimed as new and desired to be protected by Letters Patent of the United States is:

1. A method of programming a memory cell of a flash memory array having a plurality of word and bit lines, the method comprising:
    applying an initial program pulse to the memory cell;
    determining if the memory cell is programmed in response to the initial program pulse; and
    if the memory cell is not programmed, applying a series of subsequent program pulses to the memory cell, determining after each whether the memory cell is programmed, and if programming of the memory cell is verified, stopping application of further programming pulses,
    wherein both initial and subsequent program pulses comprise application of a first voltage to the memory cell for a first application period followed by application of a second, higher voltage to the memory cell for a second, longer, application period.

2. The method of claim 1, wherein the first voltage and first application period are the same for initial and subsequent program pulses.

3. The method of claim 1, comprising increasing the second voltage for each subsequent program pulse.

4. The method of claim 3, wherein each increase is the same.

5. The method of claim 1, wherein the second application period of subsequent program pulses is shorter than the second application period of the initial program pulse.

6. The method of claim 1, wherein the first voltage is a voltage at which programming of the memory cell is inhibited.

7. The method of claim 6, wherein the second voltage is a voltage at which the memory cell is programmed.

8. The method of claim 1, wherein the subsequent program pulses are applied until a threshold voltage of the memory cell is met.

9. The method of claim 1, further comprising maintaining a count of the number of subsequent program pulses applied to the memory cell.

10. The method of claim 9, further comprising registering a programming failure if the number of subsequent program pulses counted exceeds a defined threshold and a subsequent verification does not determine that the memory cell is programmed.

11. A flash memory device comprising:
- a plurality of flash memory cells;
- a plurality of word and bit lines connecting the plurality of flash memory cells; and
- a control circuit coupled to the memory cells for applying a plurality of program pulses to the memory cells, the control circuit being configured to:
- apply an initial program pulse to a given memory cell,
- determine if the memory cell is programmed in response to the initial program pulse, and
- if the memory cell is not programmed, apply a series of subsequent program pulses to the memory cell, determining after each whether the memory cell is programmed, and if programming of the memory cell is verified, stopping application of further programming pulses,
- wherein both initial and subsequent program pulses comprise application of a first voltage to the memory cell for a first application period followed by application of a second, higher voltage to the memory cell for a second, longer, application period.

12. The flash memory device of claim 11, wherein the control circuit comprises:
- a pulse counter;
- a voltage pump;
- a voltage control circuit which receives a pulse count from the pulse counter and regulates said voltage pump to output an appropriate voltage level;
- a timing control circuit which receives the pulse count from the pulse counter and regulates a total pulse width of said program pulses by controlling when said pump is activated and deactivated; and
- a voltage switch controlled by said timing control circuit to output said program pulses.

13. The flash memory device of claim 12, wherein the control circuit is further configured to register a programming failure if the pulse count exceeds a defined threshold and subsequent verification of programming of the memory cell is unsuccessful.

14. The flash memory device of claim 11, wherein the first voltage and first application period are the same for initial and subsequent program pulses.

15. The flash memory device of claim 11, wherein the second application period of subsequent program pulses is shorter than the second application period of the initial program pulse.

16. A method of programming a plurality of memory cells of a flash memory array, the method comprising:
- applying a first program pulse to a plurality of memory cells, the first program pulse comprising application of a first voltage to the memory cells for a first application period followed by application of a second, higher voltage to the memory cells for a second, longer, application period;
- determining whether the memory cells are programmed in response to the first program pulse; and
- for each of the memory cells that is not programmed, applying a second program pulse comprising application of the first voltage to the memory cells for the first application period followed by application of a third voltage to the memory cells for a third application period, the third voltage and application period being higher and shorter than the second voltage and application period, respectively.

17. The method of claim 16, further comprising:
- determining whether the memory cells are programmed after the application of the second program pulse; and
- for each of the memory cells that is not programmed, applying a third program pulse comprising application of the first voltage to the memory cells for the first application period followed by application of a fourth voltage to the memory cells for the third application period, the fourth voltage being higher than the third voltage by an amount equal to a difference between the third voltage and second voltage.

18. The method of claim 17, further comprising:
- determining whether the memory cells are programmed after the application of the third program pulse; and
- registering a programming failure for each of the memory cells that is not programmed.

19. The method of claim 17, wherein the first voltage is a voltage at which programming of the memory cells is inhibited.

20. The method of claim 19, wherein the second voltage is a voltage at which the memory cell is programmed.

* * * * *